(12) United States Patent
Kunnen et al.

(10) Patent No.: US 8,970,822 B2
(45) Date of Patent: Mar. 3, 2015

(54) SUPPORT TABLE FOR A LITHOGRAPHIC APPARATUS, LITHOGRAPHIC APPARATUS AND DEVICE MANUFACTURING METHOD

(75) Inventors: Johan Gertrudis Cornelis Kunnen, Weert (NL); Martijn Houben, 's-Hertogenbosch (NL); Thibault Simon Mathieu Laurent, Eindhoven (NL); Hendrikus Johannes Marinus Van Abeelen, Moergestel (NL); Armand Rosa Jozef Dassen, Geldrop (NL); Sander Catharina Reinier Derks, Budel (NL)

(73) Assignee: ASML Netherlands B.V., Veldhoven (NL)

(*) Notice: Subject to any disclaimer, the term of this patent is extended or adjusted under 35 U.S.C. 154(b) by 2 days.

(21) Appl. No.: 13/586,689

(22) Filed: Aug. 15, 2012

(65) Prior Publication Data

US 2013/0094005 A1  Apr. 18, 2013

Related U.S. Application Data

(60) Provisional application No. 61/524,644, filed on Aug. 17, 2011, provisional application No. 61/546,883, filed on Oct. 13, 2011.

(51) Int. Cl.
*G03F 7/20* (2006.01)
*H01L 21/68* (2006.01)

(52) U.S. Cl.
CPC ........ *G03F 7/70875* (2013.01); *G03F 7/70716* (2013.01); *H01L 21/68* (2013.01); *G03F 7/707* (2013.01)

USPC ................................. 355/72; 355/30; 355/77

(58) Field of Classification Search
CPC . G03F 7/707; G03F 7/70716; G03F 7/70875; G03F 7/70858; H01L 21/677; H01L 21/68; H01L 21/683
USPC ........................ 279/3, 128; 355/30, 53, 72, 77
See application file for complete search history.

(56) References Cited

U.S. PATENT DOCUMENTS

| 4,509,852 | A | 4/1985 | Tabarelli et al. |
| 5,761,023 | A | 6/1998 | Lue et al. |
| 7,196,768 | B2 | 3/2007 | Ottens et al. |
| 7,532,310 | B2 | 5/2009 | Mertens et al. |

(Continued)

FOREIGN PATENT DOCUMENTS

| CN | 1637610 | 7/2005 |
| CN | 1804725 | 7/2006 |

(Continued)

OTHER PUBLICATIONS

Japanese Office Action mailed Aug. 28, 2013 in corresponding Japanese Patent Application No. 2012-167096.

*Primary Examiner* — Colin Kreutzer
(74) *Attorney, Agent, or Firm* — Pillsbury Winthrop Shaw Pittman LLP

(57) ABSTRACT

A support table for a lithographic apparatus, the support table having a support section and a conditioning system, wherein the support section, the conditioning system, or both, is configured such that heat transfer to or from a substrate supported on the support table, resulting from the operation of the conditioning system, is greater in a region of the substrate adjacent an edge of the substrate than it is in a region of the substrate that is at the center of the substrate.

20 Claims, 10 Drawing Sheets

(56) References Cited

U.S. PATENT DOCUMENTS

| | | |
|---|---|---|
| 8,502,960 B2 | 8/2013 | Brinkhof et al. |
| 2002/0002944 A1 | 1/2002 | Shirley |
| 2004/0207824 A1 | 10/2004 | Lof et al. |
| 2006/0033892 A1 | 2/2006 | Cadee et al. |
| 2006/0038968 A1 | 2/2006 | Kemper et al. |
| 2006/0087637 A1 | 4/2006 | Ottens et al. |
| 2006/0096972 A1 | 5/2006 | Nakamura |
| 2006/0102849 A1 | 5/2006 | Mertens et al. |
| 2006/0158627 A1 | 7/2006 | Kemper et al. |
| 2006/0207725 A1 | 9/2006 | Oohashi et al. |
| 2007/0070315 A1 | 3/2007 | Jacobs et al. |
| 2007/0247779 A1 | 10/2007 | Nakamura |
| 2008/0068580 A1 | 3/2008 | Mori et al. |
| 2008/0137055 A1 | 6/2008 | Hennus et al. |
| 2008/0212046 A1 | 9/2008 | Riepen et al. |
| 2008/0212050 A1* | 9/2008 | Poon et al. ............... 355/30 |
| 2009/0254226 A1 | 10/2009 | Iwanaga et al. |
| 2009/0279060 A1 | 11/2009 | Direcks et al. |
| 2009/0279061 A1* | 11/2009 | Jacobs et al. ............ 355/30 |
| 2009/0279062 A1 | 11/2009 | Direcks et al. |
| 2011/0007288 A1 | 1/2011 | Brinkhof et al. |
| 2011/0128517 A1 | 6/2011 | Ottens et al. |
| 2011/0181849 A1 | 7/2011 | Patel et al. |
| 2011/0222032 A1 | 9/2011 | Ten Kate et al. |
| 2011/0228248 A1 | 9/2011 | Lafarre et al. |
| 2012/0013865 A1 | 1/2012 | Laurent et al. |
| 2013/0045447 A1* | 2/2013 | Kunnen et al. ............ 430/322 |

FOREIGN PATENT DOCUMENTS

| | | | |
|---|---|---|---|
| CN | 102067039 | 5/2011 | |
| EP | 1 420 298 | 5/2004 | |
| JP | 03192246 A * | 8/1991 | ............ G03B 27/72 |
| JP | H06-069125 | 3/1994 | |
| JP | 2004-039862 | 2/2004 | |
| JP | 2004-511907 | 4/2004 | |
| JP | 2006-128682 | 5/2006 | |
| JP | 2008-172214 | 7/2008 | |
| JP | 2009-076940 | 4/2009 | |
| JP | 2009-266886 | 11/2009 | |
| JP | 2011-023716 | 2/2011 | |
| JP | 2011-151397 | 8/2011 | |
| JP | 2013-042127 | 2/2013 | |
| WO | 99/49504 | 9/1999 | |

* cited by examiner

SUPPORT TABLE FOR A LITHOGRAPHIC APPARATUS, LITHOGRAPHIC APPARATUS AND DEVICE MANUFACTURING METHOD

This application claims priority and benefit under 35 U.S.C. §119(e) to U.S. Provisional Patent Application No. 61/524,644, filed on Aug. 17, 2011 and to U.S. Provisional Patent Application No. 61/546,883, filed on Oct. 13, 2011. The content of each of the foregoing applications is incorporated herein in its entirety by reference.

FIELD

The present invention relates to a support table for a lithographic apparatus, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Utilizing immersion fluid in a lithographic apparatus may introduce certain difficulties. For example, the use of immersion fluid may result in an additional heat load within the lithographic apparatus, which may affect the accuracy of formation of an image on a substrate.

In some instances the heat load may be non-uniform across a substrate, resulting in non-uniform variation of the image. By way of example, a heat load may be caused by operation of a fluid handling system and/or by evaporation of the immersion fluid. These effects may be localized to a part of a substrate. Consequently, there may be a localized temperature change in the substrate, resulting in a localized thermal expansion or contraction of the substrate. This is turn may result in a localized variation in a overlay error and/or critical dimension (CD).

It is desirable, for example, to provide a system in which the effect of a localized heat load can be reduced.

According to an aspect of the invention, there is provided a support table for a lithographic apparatus, comprising: a support section, configured to support a lower surface of a substrate on an upper face thereof; and a conditioning system, configured to supply heat energy to and/or remove heat energy from the support section; wherein, when a substrate is supported by the support section, it is thermally coupled to the support section such that, when the conditioning system supplies heat energy to or removes heat energy from the support section, energy in turn transfers from the support section to the substrate or to the support section from the substrate, respectively; and the support section, the conditioning system, or both, is configured such that the heat transfer to or from the substrate per unit area of the substrate as a result of the operation of the conditioning system is greater in a first region of the substrate that is adjacent the edge of the substrate than it is in a second region of the substrate that is at the center of the substrate.

According to an aspect of the invention, there is provided a support table for a lithographic apparatus, the support table comprising:

a support section, configured to support a lower surface of a substrate on an upper surface of the support section, the upper surface of the support section comprising a base surface, configured to be substantially parallel to the lower surface of the substrate when supported on the support section, and comprising a plurality of burls protruding from the base surface and arranged such that, when the substrate is supported by the support section, the substrate is only in contact with the upper surface of the burls, wherein the burls are configured such that the stiffness of the burls in a direction parallel to the upper surface of the support section is greater for burls in contact with a first region of the substrate that is adjacent to an edge of the substrate than for burls in contact with a second region of the substrate that is at the center of the substrate, and the stiffness of the burls in a direction perpendicular to the upper face of the support section is substantially the same for burls in contact with the first and second regions of the substrate.

According to an aspect of the invention, there is provided a lithographic apparatus, comprising: a support table, configured to support a substrate; a conditioning system, configured to supply heat energy to and/or remove heat energy from the support table; a position measurement system, configured to measure the position of the support table within the lithographic apparatus; and a controller, configured to control the conditioning system to supply heat energy to and/or remove heat energy from the support table based on information including the measured position of the support table.

According to an aspect of the invention, there is provided a lithographic apparatus, comprising: a support table, configured to support a substrate; a conditioning system, configured to supply heat energy to and/or remove heat energy from the support table; and a controller, configured to control the conditioning system to supply heat energy and/or remove heat energy from the support table, the controller configured such that, when the support table is at a location for a substrate to be loaded to the support table, it controls the conditioning system to start to supply heat energy to and/or remove heat energy from the support table that is expected to be required before the substrate is loaded to the support table.

According to an aspect of the invention, there is provided a device manufacturing method, comprising using a lithographic apparatus to transfer a pattern from a patterning device to a substrate, wherein the lithographic apparatus comprises a support table configured to support the substrate, a conditioning system configured to supply heat energy to and/or remove heat energy from the support table, and a position measurement system configured to measure the position of the support table within the lithographic apparatus, the method comprising: controlling the conditioning system to supply heat energy to and/or remove heat energy from the support table based on information including the measured position of the support table.

According to an aspect of the invention, there is provided a device manufacturing method, comprising using a lithographic apparatus to transfer a pattern from a patterning device to a substrate, wherein the lithographic apparatus comprises a support table configured to support the substrate, and a conditioning system configured to supply heat energy to and/or remove heat energy from the support table, the method comprising: controlling the conditioning system to supply heat energy to and/or remove heat energy from the support table that is expected to be required before the substrate is loaded to the support table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
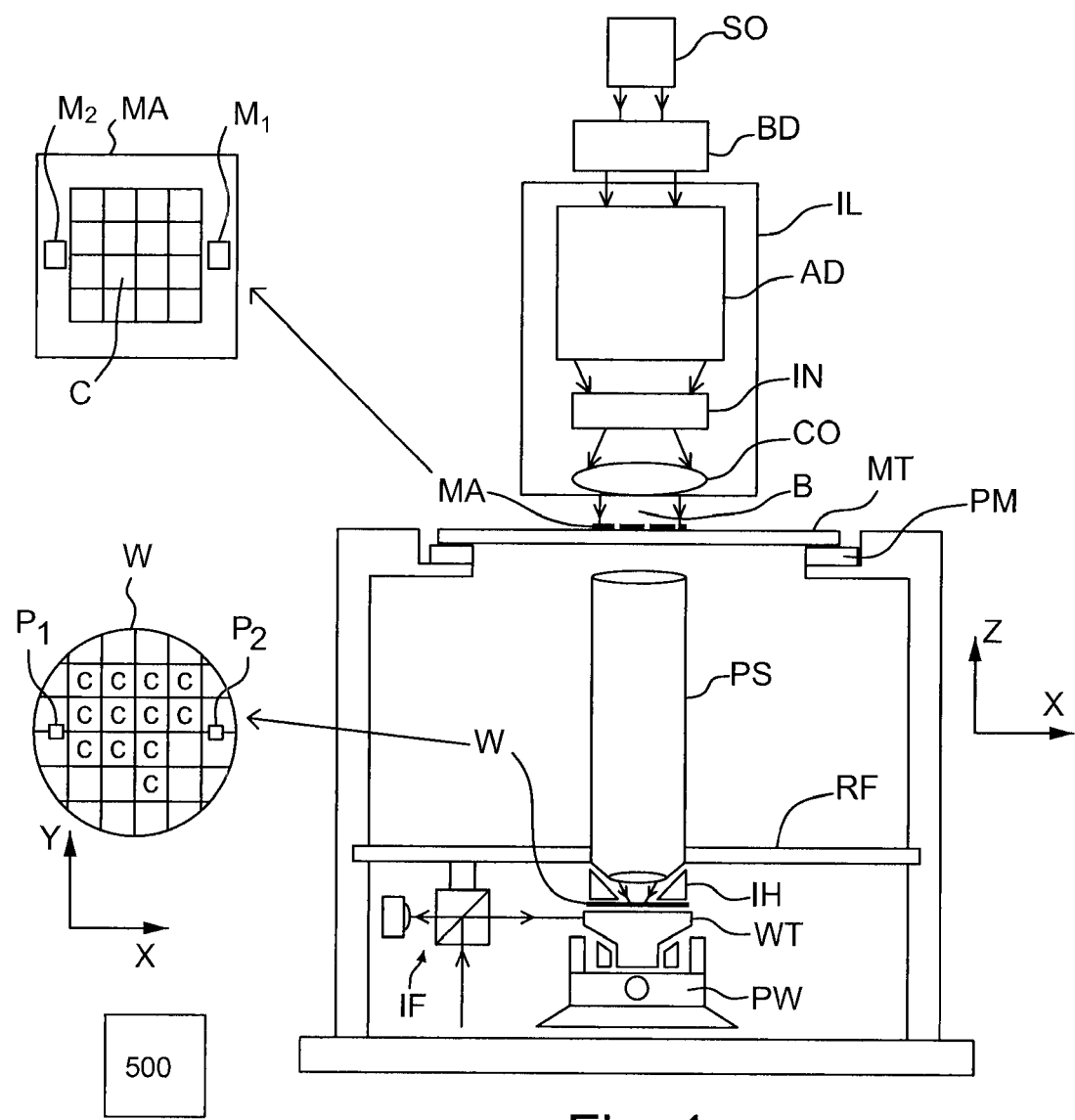
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
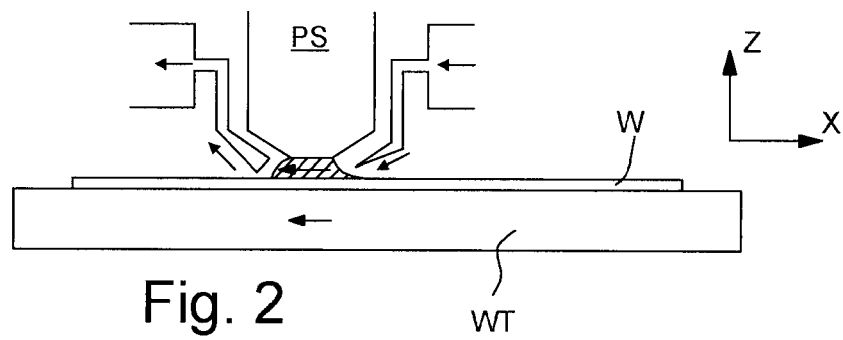
FIGS. 2 and 3 depict a liquid supply system for use in a lithographic projection apparatus.
Figure 3:
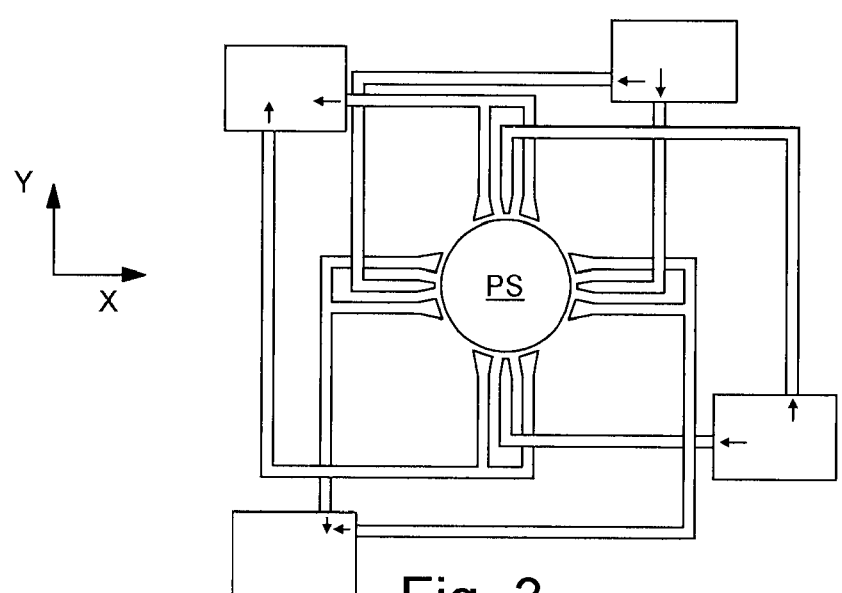

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
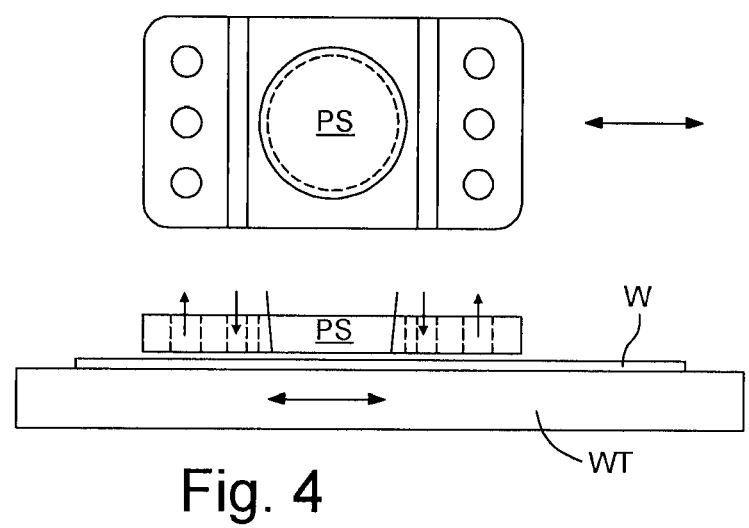
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Figure 5:
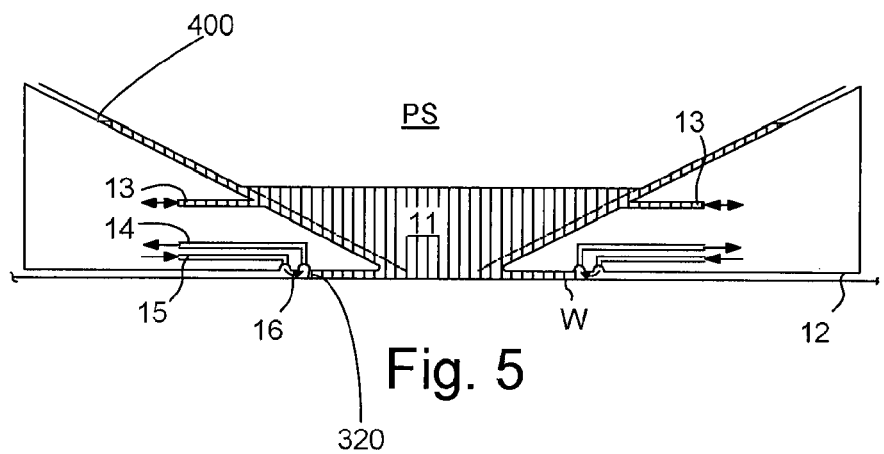
FIG. 5 depicts a further liquid supply system for use in a lithographic projection apparatus.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
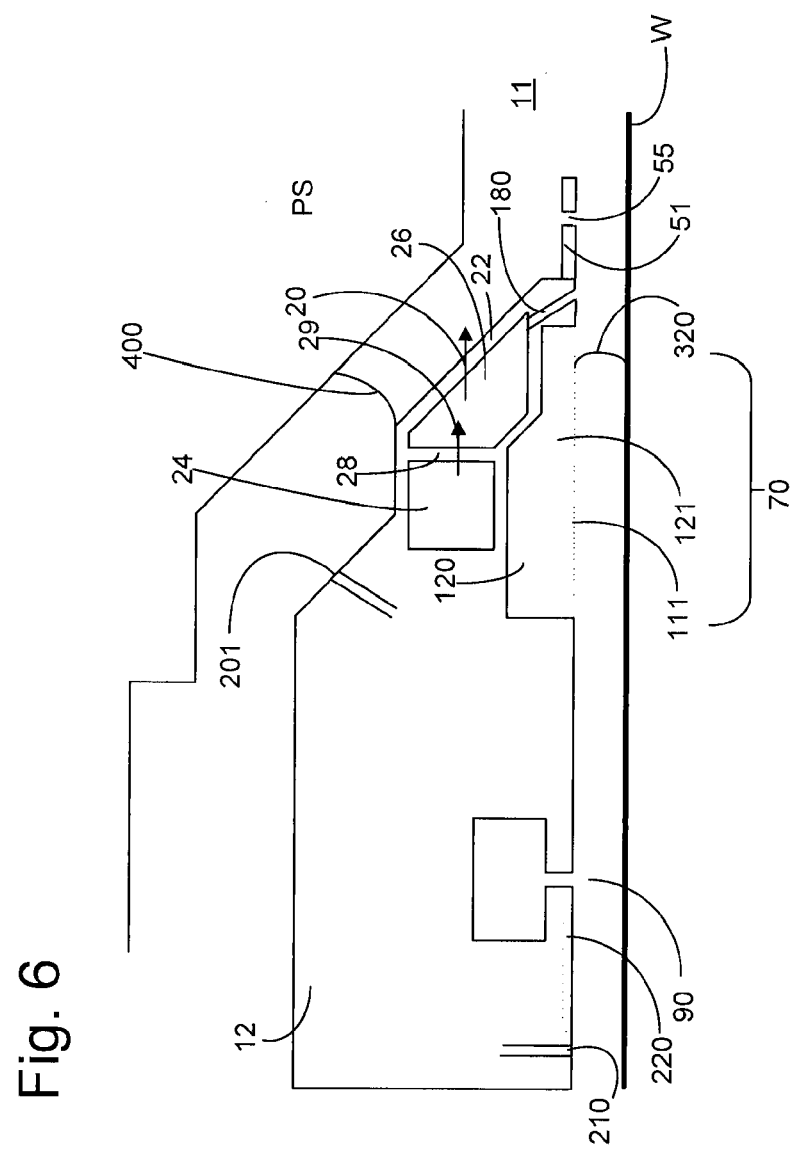
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 23 in the surface which in part defines the space 11 provides the liquid to the space 11. The liquid passes through openings 29, 23 in side walls 28, 32 respectively through respective chambers 34, 36 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 53 which extends into the space 11. The control plate 53 may have an opening 55 to permit flow liquid therethrough; the opening 55 may be beneficial if the control plate 53 is displaced in the Z direction (e.g., parallel to the optical axis of the projection system PS). Radially outwardly of the flow control plate 53 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain high relative to the structure 12.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Within a lithographic apparatus, a substrate may be supported on a support table. In particular, the support table may include a support section that is configured to support a lower surface of the substrate. An upper face of the support section may, for example, include a base surface having a plurality of burls protruding from base surface. The lower surface of the substrate may be supported on the upper faces of the burls. Such an arrangement may minimize or reduce the total area of the substrate in contact with the support table, minimizing or reducing the likelihood of contaminants being transferred between the support table and the substrate and/or minimizing or reducing the likelihood of a contaminant being located between the substrate and its support on the support table, which may result in a deformation of the substrate.

In an embodiment, the space around the burls, below the substrate, may be connected to an under-pressure source. Accordingly, the substrate may be vacuum clamped to the support table.

In the event of a local heat load acting on the substrate and/or the support table, there may be a local temperature variation within, for example, the substrate, resulting in a local thermal expansion or thermal contraction, most significantly in a direction parallel to the upper and lower major faces of the substrate. However, the thermal expansion and/or thermal contraction of the substrate may be resisted by the support table, to which the substrate is clamped. In particular, the forces to resist the thermal expansion and/or thermal contraction may be applied to the substrate via the burls.

In a region towards the center of the substrate, there are burls in every direction around each local part of the substrate. These surrounding burls may provide the forces to resist a thermal expansion and/or thermal contraction. However, in regions around the edge of the substrate, there is only contact with burls in directions towards the center of the substrate. In other words, there are no forces applied to a region of the substrate to resist a thermal expansion and/or thermal contraction from beyond the edge of the substrate.

Consequently, for a given temperature change of a local area of the substrate, the net thermal expansion or contraction of the substrate, namely after taking into account the resistance to expansion or contraction provided by the contact with the burls, will be greater in regions close to the edge of a substrate than in the center of the substrate.

This effect applies not only to thermal expansion and/or contraction caused by a local heat load and/or local temperature change of the substrate but also to a heat load and/or temperature change that applies uniformly across the substrate.

In order to reduce or minimize temperature change within a substrate, a conditioning system may be provided that supplies heat energy to and/or removes heat energy from the support section of the support table. Accordingly, heat can be supplied or removed in order to compensate for a heat load on the substrate and/or support table. The conditioning system may provide heat directly to or remove heat directly from the support section to compensate for a heat load on the support table. Furthermore, the conditioning system may provide heat to or remove heat from the support section such that heat flows from the support section to the substrate, or from the substrate to the support section, in order to compensate for a heat load on the substrate.

In an embodiment of the present invention, the support section, the conditioning system, or both, is configured such that, during use, heat transfer to or from the substrate resulting from the operation of the conditioning system is not uniform across the substrate.

In particular, in an embodiment, the system is configured such that the heat transfer to or from the substrate per unit area of the substrate is greater in one or more regions of the substrate at the edge of the substrate than in one or more regions located at or near the center of the substrate. In other words, the support section and/or conditioning system are configured such that the effect of the conditioning system is greater at the edge region of a substrate than in the central region.

Such a system may be configured such that, for a given heat load, the temperature change of a substrate in its edge region may be less than the temperature change of the substrate in its central region. This may compensate for the variation discussed above in the resulting thermal expansion and/or thermal contraction across a substrate for a given local temperature change. Accordingly, the variation in the resulting expansion and/or contraction of the substrate across the substrate may be reduced or minimized.

Described below are different embodiments that may result in greater heat transfer to or from the substrate per unit area of the substrate in an edge region than the central region of a substrate during operation of the conditioning system.

There may be a gradual change from one or more edge regions, in which the effect of the conditioning system is maximized or increased, to one or more inner regions of a substrate in which the effect of the conditioning system is not as great.

In an embodiment of the invention, the support section and/or conditioning system may be configured such that there is a clear distinction between an edge region in which the effect of the conditioning system is greater, and a central region, in which the effect of the conditioning system is relatively reduced.

In either case, the arrangement of the relative locations of the edge and central regions may be selected appropriately in order that the variation in effect of the conditioning system best compensates for the variation in the thermal expansion and/or thermal contraction of a substrate in response to a local temperature change, as discussed above.

A support table according to an embodiment of the present invention may utilize any combination of these aspects.

Figure 7:
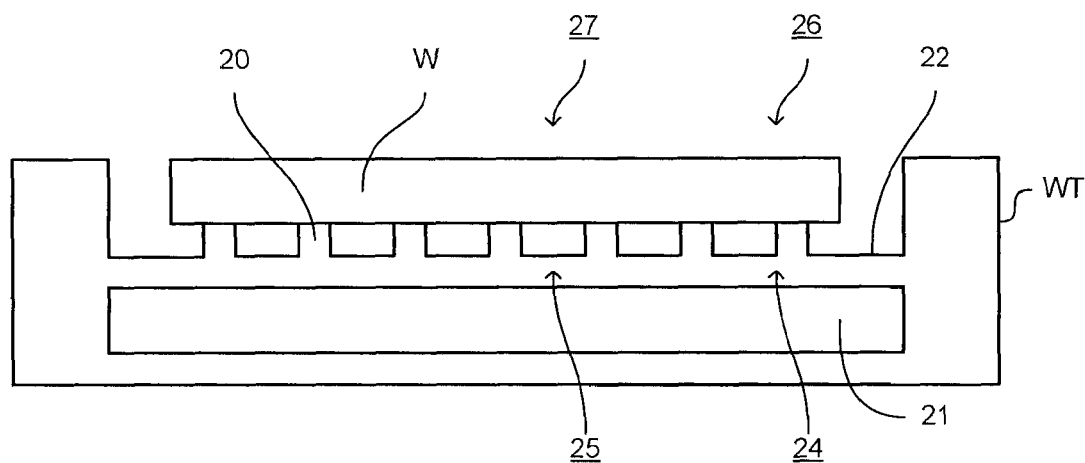
FIG. 7 depicts, in cross-section, a support table that may be used in an embodiment of the invention.

FIG. 7 schematically depicts a support table WT in which an embodiment of the invention may be provided. The embodiment depicted in FIG. 7 is simplified and features of a substrate table not required to explain an embodiment of the present invention are not depicted. Nevertheless, a support table of an embodiment of the present invention may include many such additional features.

As shown, the support table WT may include a support section 22 that is configured to support a substrate W. In particular, the substrate W may be supported by means of a plurality of burls 20. The support table WT further includes a conditioning system 21 that supplies heat energy to and/or removes heat energy from the support section 22.

The substrate W is thermally coupled to the support section 22, for example by means of heat conduction through the burls 20 that are in physical contact with the lower surface of the substrate W. In other words, when the conditioning system 21 supplies heat energy to or removes heat energy from the support section 22, energy in turn transfers from the support section to the substrate or to the support section from the substrate, respectively.

As discussed below, the support section 22 and/or the conditioning system 21 are configured such that, during operation, heat transfer to or from the substrate per unit area of the substrate is greater in a first, outer, region 26 of the substrate W, namely one that is adjacent to the edge of the substrate W, than it is in a second, inner, region 27 of the substrate. For convenience of description, it will be appreciated that the support section 22 includes an outer region 24 that is adjacent to, and thermally coupled to, the outer region 26 of the substrate W. The support section further includes an inner region 25 that is adjacent to, and thermally coupled to, the inner region 27 of the substrate W.

Figure 8:
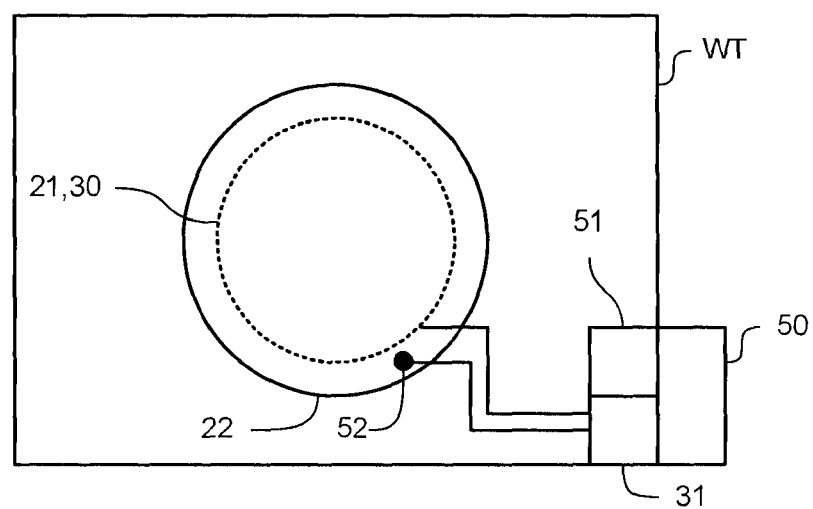
FIG. 8 depicts, in plan view, an arrangement of a support table that may be used in an embodiment of the invention.

FIG. 8 schematically depicts an embodiment of the invention. As shown, the conditioning system 21 includes a heater system 30 that can provide to the support section more heat energy per unit area of the upper face of the support section 22 in the outer region 24 than in the inner region 25.

Figure 9:
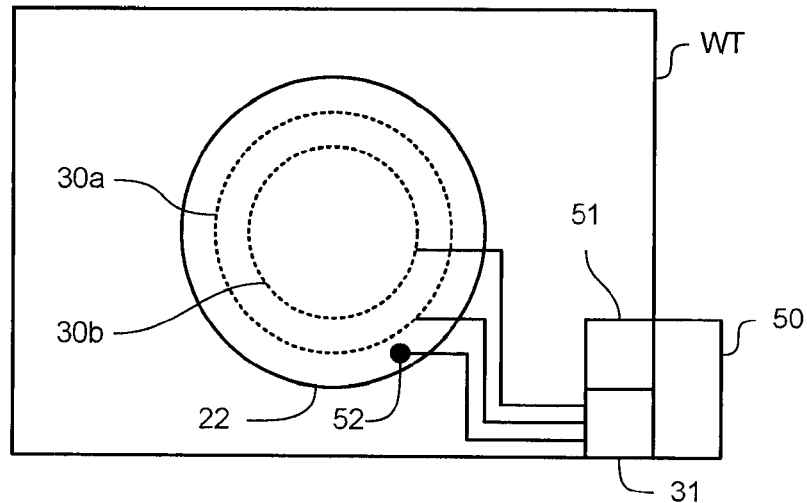
FIG. 9 depicts, in plan view, a support table according to an embodiment of the invention.

As shown in FIG. 9, in an embodiment, such a heater system may include at least first and second heater units 30a, 30b that are independently controllable, for example by a controller 31. At least one heater unit 30a may be configured to provide heat to the outer region 24 of the support section 22 and at least one other heater unit 30b may be configured to provide heat energy to the inner region 25 of the support section 22.

By controlling the heater units 30a, 30b independently, greater heat energy per unit area of the upper face of the support section 22 may be provided to the outer region 24 than the inner region 25. For example, the heater units 30a, 30b may be electric heaters of similar construction, such as resistive heaters. In that case, the controller 31 may be configured such that, in operation, the electric current provided to the heater unit 30a heating the outer region 24 of the support section 22 is greater than the electric current provided to the heater unit 30b providing heat to the inner region 25 of the support section 22. In an embodiment, thin film heaters may be used. A thin film heater may comprise a heating element formed as a thin layer for example. The thin film heaters may be applied by glue or as a coating for example.

Alternatively or additionally, the heater system 30 may be configured such that, for a common input, the heat generated per unit area of the upper face of the support section 22 is greater in the outer region 24 than in the inner region 25.

For example, if the heater system 30 comprises an elongate electric heating element, for example a resistive heating element, the heating system may be configured such that there is a greater length of heating element per unit area of the upper face of the support section 22 in the outer region 24 than in the inner region 25.

Such a system may enable the use of a single heating unit, such as a single elongate electric heating element to provide heat to both the outer region 24 and the inner region 25. This may be achieved by a difference in the arrangement of the electric heating element in the outer and inner regions 24, 25. Advantageously such a system may only require a single controller.

Figure 10:
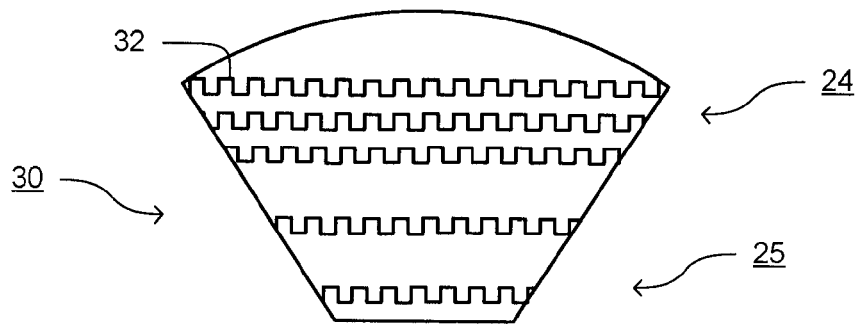
FIGS. 10 and 11 depict, in plan view, details of a part of a support table according to an embodiment of the invention.
Figure 11:
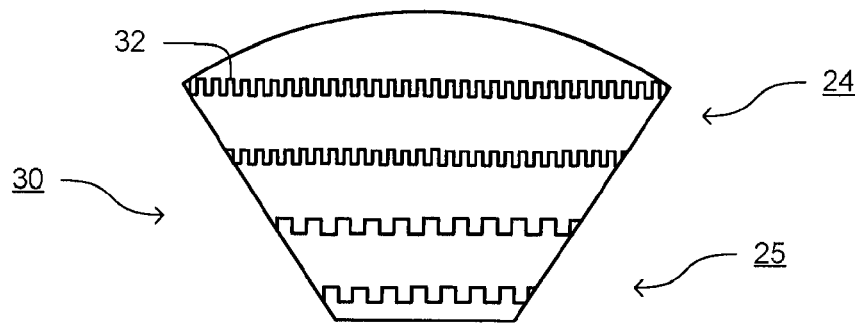

FIGS. 10 and 11 depict arrangements of such an embodiment. In each case, a portion of the support section 22 is shown, together with portions of an elongate electric heating element 32 that is used to form the heating system 30.

As shown in FIG. 10, a greater length of heating element per heating area of the upper face of the support section 22 may be achieved in the outer region 24 by reducing the separation between adjacent sections of the elongate electric heating element 32 in comparison to the inner region 25.

Alternatively or additionally, as shown in FIG. 11, in an arrangement in which the elongate electric heating element 32 is provided along a meandering path, the meanders of the elongate electric heating element 32 may be more tightly arranged in the outer region 24 than in the inner region 25.

In an embodiment, the conditioning system may comprise a channel 35 within the support section 22. A conditioning fluid may be provided to flow through the channel 35. The conditioning system may include a conditioning unit (not shown) that supplies the conditioning fluid to the channel, optionally drives the conditioning fluid through the channel, for example following a path through a plurality of regions of the support section 22, and removes the conditioning fluid once it has completed the path within the support section 22. The conditioning unit may include a heater and/or a cooler in order to adjust the temperature of the conditioning fluid supplied to the channel 35 in order that the conditioning fluid may provide heat to the support section 22 and/or remove heat from the support section 22 as it flows along the path through the support section 22.

Figure 12:
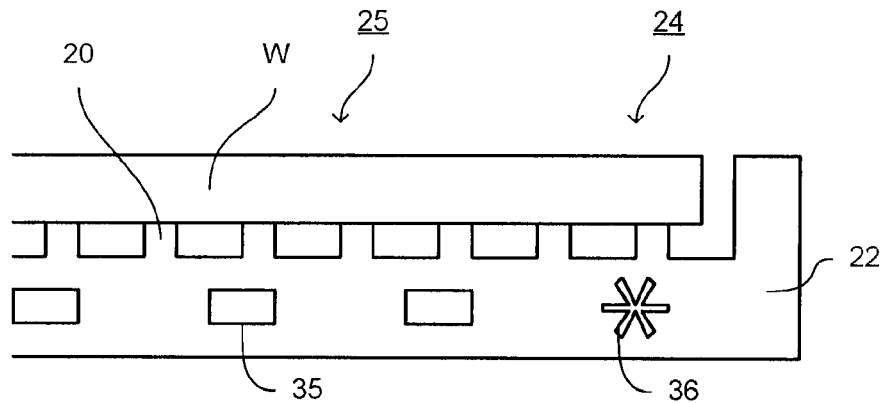
FIGS. 12 through 21 each depict, in cross-section, details of support tables that may be used according to embodiments of the invention.

In an embodiment, the path for the channel 35 may be configured such that the channel passes through at least the outer region 24 and the inner region 25 of the support section 22. As depicted in FIG. 12, the channel 35 may pass through one or both of the regions a plurality of times.

In an embodiment, a section 36 of the channel 35 within the outer region 24 of the support section 22 may be modified in order to increase the heat transfer from the conditioning fluid within the modified section 36 of the channel 35 to the outer region 24 of the support section 22 in comparison with the heat transfer from the conditioning fluid in unmodified sections of the channel 35 within the inner region 25 of the support section 22.

In an embodiment, the modified section 36 of the channel 35 may have a smaller cross-sectional area than the sections of the channel 35 within the inner region 25 of the support section 22. This will result in the velocity of the conditioning fluid within the modified section 36 of the channel 35 being larger than the velocity of the conditioning fluid in the unmodified sections of the channel 35, in order that the volume flow rate is the same. As a consequence of the increase in velocity, turbulence in the conditioning fluid may be increased, increasing the heat transfer between the conditioning fluid and the support section where it passes through the modified section 36 of the channel 35.

Alternatively or additionally, the modified section 36 of the channel 35 may be configured such that the surface roughness of the channel in the modified section 36 is greater than in the unmodified section of the channel 35. Again, this may increase the heat transfer between the conditioning fluid and the support section in the outer region 24 in contrast to the transfer within the inner region 25. For example, the surface roughness may induce turbulence in the flow.

Alternatively or additionally, the path along which the modified section 36 of the channel 35 passes within the outer region 24 may be configured to have a greater number of corners and/or have sharper corners than in comparison to the unmodified section of the channel 35 within the inner region 25 of the support section 22. This may increase the turbulence of the flow of the conditioning fluid in the modified section 36 of the channel 35, again increasing the heat transfer between the conditioning fluid and the support section 22 in the outer region 24.

Alternatively or additionally, as specifically depicted in FIG. 12, the modified section 36 of the channel 35 within the outer region 24 of the support section 22 may be arranged such that the perimeter of the cross-section of the modified section 36 of channel 35 is greater than the unmodified section of channel 35 within the inner region 25 of the support section 22. Increasing the perimeter of the cross-section of the modified section 36 of the channel 35 results in an increase in the contact area between the conditioning fluid and the support section 22 for a given unit area of the upper face of the support section 22 in the outer region 24 in comparison with the inner region 25.

By appropriate selection of the shape of the cross-section of the channel 35 in the modified section 36, it is possible to have an increased perimeter of the cross-section of the channel 35 in comparison with a non-modified section of the channel 35 but still have a smaller total cross-sectional area of the channel 35 in a modified section 36 in comparison with an unmodified section. This may, for example, be achieved by selecting a cross-section having a shape in which at least a part has a relatively high aspect ratio.

In an embodiment, the path for the channel conveying the conditioning fluid may be configured such that the separation between adjacent sections 37 of the channel 35 within the outer region 24 of the support section 22 is less than the separation between adjacent sections of the channel 35 in the inner region 25. As before, this may increase the heat transfer between the conditioning fluid and the outer region 24 of the support section 22 in contrast with the heat transfer between the conditioning fluid and the inner region 25 of the support section 22.

Such an arrangement may be arranged such that the total volume of the channel 35 corresponding to a given area of the upper face of the support section 22 is greater in the outer region 24 than in the inner region 25, increasing the heat transfer in the outer region 24 in comparison with the inner region 25.

Figure 13:
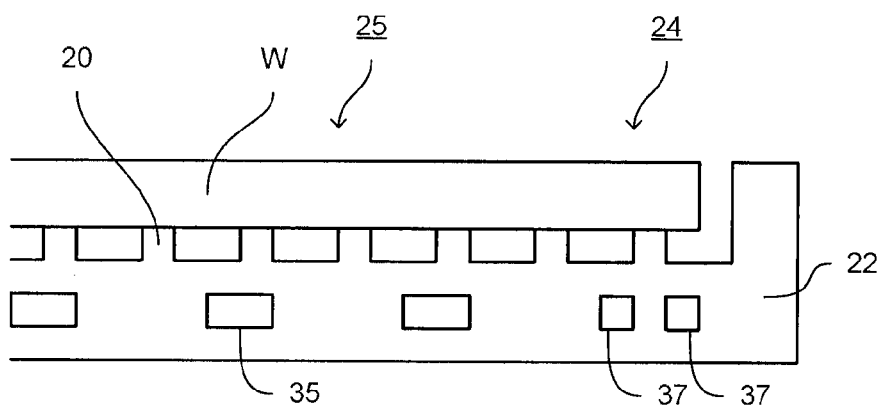

As shown in FIG. 13, such an arrangement may be achieved in total, even if the cross-sectional area of each of the sections 37 of the channel 35 within the outer region 24 are smaller than the cross-sectional area of sections of the channel 35 within the inner region 25 of the support section 22. Accordingly, one may have the combined benefit of a greater volume of conditioning fluid passing through a region of the support section 22 corresponding to a given area of the upper face of the support section 22 in the outer region 24 in comparison with the inner region 25 while also providing a higher conditioning fluid velocity in the sections 37 of the channel 35 within the outer region 24 in comparison with that in the inner region 25 of the support section 22 with the benefit discussed above.

In an embodiment, a section of the channel 35 may divide into parallel sub-channels. For example, part-way along the channel 35 a part of it may branch into two or more sections. This may provide adjacent sections 37 of the channel 35, for example as shown in FIG. 13.

Figure 14:
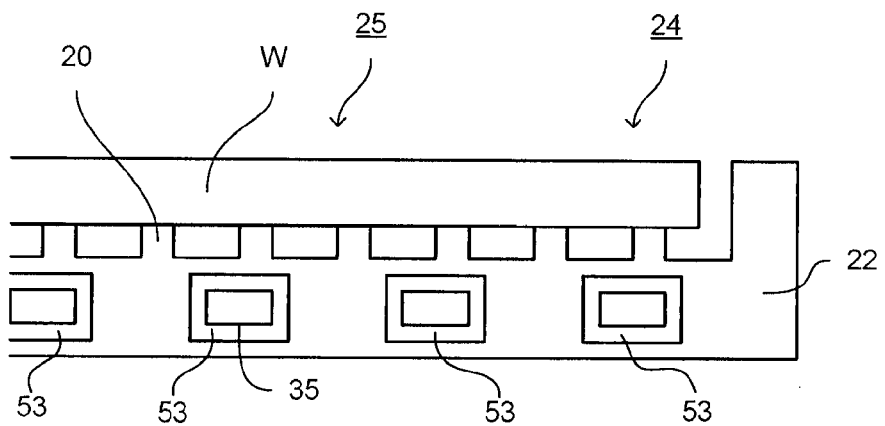

Alternatively or additionally, as specifically depicted in FIG. 14, a channel heater 53 may be provided in, adjacent to, or surrounding one or more of the channels 35. The channel heater 53 may comprise a plurality of heaters. The spatial density of the plurality of heaters may be arranged to be higher in the outer region 24 than in the inner region 25. In an embodiment, the heaters may be more closely spaced in the outer region 24 than in the inner region. In an embodiment, the heaters may be larger, for example longer, in the outer region 24 than in the inner region 25. In an embodiment, the heaters may surround the channels to a greater extent in the outer region 24 than in the inner region 25. In an embodiment, the heaters may be arranged to supply heat to a greater proportion of the surface area of the channels 35 in the outer region 24 than in the inner region 25 (e.g. by being more closely spaced, longer and/or by surrounding the channels 35 to a greater extent). A higher spatial density of heaters may be able to supply a higher heating power per unit area of the support section 22 in the outer region 24 in comparison with the inner region 25 without requiring a complex control system to adjust the heating powers of individual heaters. In an embodiment, the heating power supplied to the heaters is the same for each heater or the same per unit area of heater.

In an embodiment, in which a conditioning fluid is provided to a channel within the support section 22, one may alternatively or additionally, configure the conditioning system such that the conditioning fluid is provided to an end of the channel 35 within the outer region 24 of the support section 22 and is extracted from an end of the channel 35 within the inner region 25 of the support section 22. Accordingly, the conditioning fluid may first pass through sections of the channel 35 within the outer region 24 of the support section 22. During this stage, the temperature difference between the conditioning fluid and the support section 22 may be at its greatest (disregarding variations in temperature across the support section 22, the temperature difference will decrease along the length of the channel 35 as heat transfers between the support section and the conditioning fluid). Accordingly, the rate of heat transfer may be at its greatest in the region through which the conditioning fluid passes first. Therefore, in an arrangement as discussed above, the rate of heat transfer between the conditioning fluid and the support section 22 may be larger in the outer region 24 than in the inner region 25 of the support section 22.

In an embodiment, for example discussed below, the support section 22 may be configured such that in the outer region 24 there is reduced resistance to transfer of heat energy between the support section 22 and the substrate W in comparison with the inner region 25.

As discussed above, the support section 22 may include a plurality of burls 20 that support the lower surface of the substrate W. The burls 20 also provide the least resistance path for thermal transfer between the support section 22 and the substrate W, by thermal conduction through the burls 20.

In an embodiment, the burls 20 are arranged such that the total area of the burls 20 in contact with the substrate W per unit area of the substrate W and/or the upper face of the support section 22 is greater in the outer region 24 than in the inner region 25. Accordingly, the percentage of the area of the substrate W in contact with a burl 20, such that heat can be transferred between the burls 20 and the substrate W, is greater in the outer region 24 than in the inner region 25.

Figure 15:
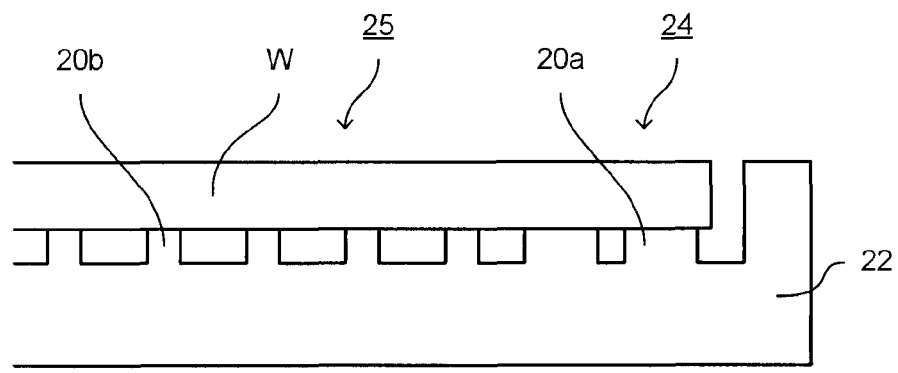

In an embodiment, as depicted in FIG. 15, this difference in the proportion of the area of the substrate in contact with a burl may be provided by using differently sized burls 20a, 20b for the outer and inner regions 24, 25 of the support section 22. In particular, the area of each burl 20a in contact with the lower surface of the substrate W may be larger in the outer region 24 than the area of the burls 20b in contact with the lower surface of the substrate W in the inner region 25.

Figure 16:
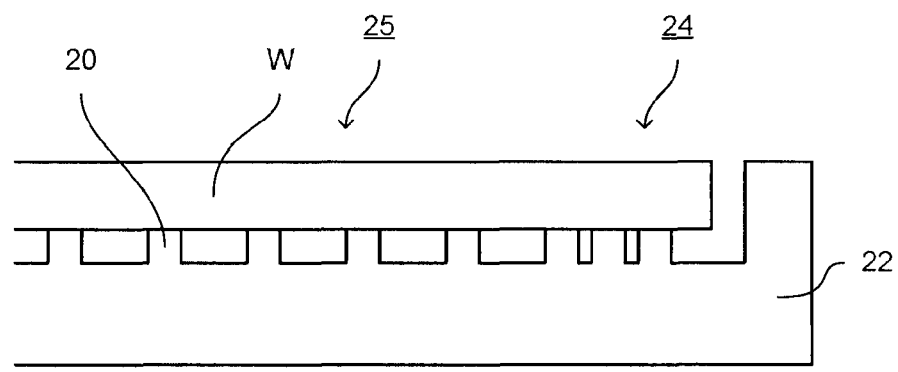

Alternatively or additionally, as depicted in FIG. 16, in an embodiment, the total area of burls 20 in contact with the lower surface of the substrate W per unit area of the substrate W may be varied across the support section 22 by adjusting the spacing of the burls 20. For example, as depicted in FIG. 16, the spacing between the burls 20 in the outer region 24 may be reduced in comparison with the spacing of the burls 20 in the inner region 25. Accordingly, the total number of burls 20 per unit area of the upper surface of the support section 22 may be larger in the outer region 24 than in the inner region 25.

Arrangements such as those described above in which there is a distribution across the substrate W of the total area of burls 20 in contact with the lower surface of the substrate W per unit area of the substrate W could cause deformation of the substrate W. In particular, such an arrangement may result in a variation in the distribution of support forces provided by the burls 20 across the substrate W. This in turn may cause a variation in the deformation of the burls 20 such that even support of the substrate W may not be provided. In an embodiment, such a variation may be partially or completely compensated by appropriate control of the vacuum clamping of the substrate W to the support section 22. In particular, the under pressure around the burls 20 may be arranged to vary across the substrate W such that the vacuum clamping force varies across the substrate W. This may be arranged, for example, by the provision of multiple openings to the space around the burls 20 to an under pressure source used to provide the vacuum clamping and by way of appropriate valving, for example, controlling the pressure at each opening.

Figure 17:
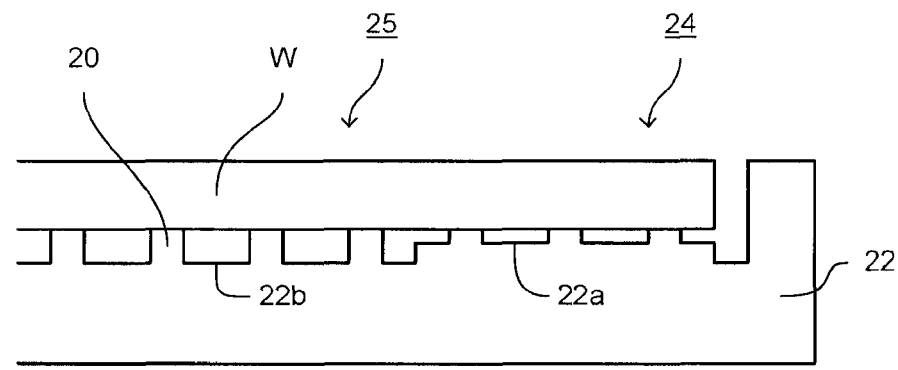

In an embodiment, as depicted in FIG. 17, the spacing of the burls 20 and the total area of each burl 20 in contact with the lower surface of the substrate W may remain constant across the support section 22. This may be advantageous because it may prevent deformation of the substrate W when it is secured to the burls 20 caused by variations in the distribution of support forces provided by the burls 20 resulting from a distribution of the total area of burls 20 in contact with the lower surface of the substrate W per unit area of the substrate W across the substrate W.

In the arrangement depicted in FIG. 17, the resistance to transfer of heat energy between the support section 22 and the substrate W is reduced in the outer region 24 in comparison with the inner region 25 by configuring the base surface of the support section 22 (from which the burls 20 protrude) such that the separation between the section 22a of the base surface in the outer region 24 and the lower surface of the substrate W is less than the separation between the section 22b of the base surface of the support section 22 and the lower surface of the substrate W in the inner region 25.

By reducing the separation in the outer region 24, an increase in the thermal conductivity through the gas gap (which may be at lower than ambient pressure) may be provided. Multiple intermediate levels may be provided for the base surface. Additionally or alternatively, a sloping surface rather than a stepped surface (as shown) may be provided.

Figure 18:
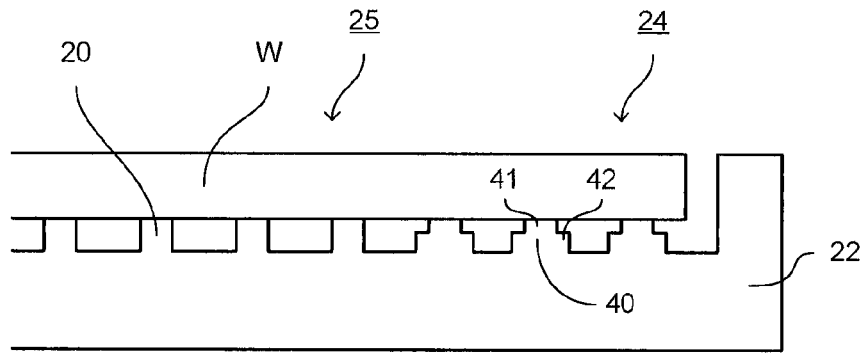

Alternatively or additionally, a reduction in the thermal resistance in the outer region 24 through the gas gap between the support section 22 and the lower surface of the substrate W may be decreased by the use of modified burls 40 in the outer region 24. As depicted in FIG. 18, the modified burls 40 may have a first portion 41 that is arranged to be in contact with the lower surface of the substrate W and may correspond to the non-modified burls 20 used in the inner region 25. The modified burls may 40 further include a second portion 42 that protrudes less from the base surface of the support section 22 than the first portion 41 and therefore does not contact the lower surface of the substrate W. Accordingly, each of the second portions 42 of the modified burls 40 provides an area in which the separation between the support section 22 and the lower surface of the substrate W is reduced but does not affect the total area of burls 20 per unit area of the lower surface of the substrate W that is in contact with the substrate W.

As shown in FIG. 18, the second portion 42 of each of the modified burls 40 may surround the first portion 41. The size of the second portions 42 need not be the same for all of the modified burls 40. Accordingly, for example, the width and/or height of the second portions 42 of the modified burls may increase with distance from the center of the support section 22 such that the resistance to thermal transfer between the support section 22 and the substrate W decreases towards the edge of the substrate W.

Figure 19:
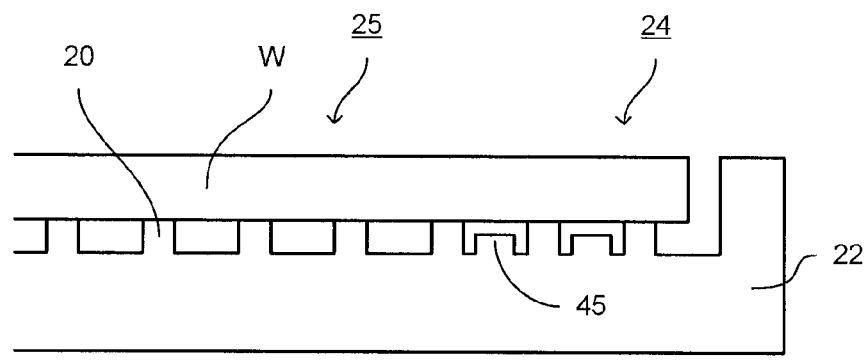

Alternatively or additionally, as depicted in FIG. 19, the support section 22 may include one or more protrusions 45 provided between the burls 20. The protrusions 45 may be arranged such that they do not adjoin any of the burls 20. This may facilitate manufacturing the support section 22. However, by providing local areas within the outer region 24 in which the separation between the upper most surface of the support section 22 and the lower surface of the substrate W is reduced, the resistance to transferring heat energy between the support section 22 and the substrate W through the gas gap may be reduced. In turn, the resistance to transfer of heat energy between the support section 22 and the substrate W may be lower in the outer region 24 than in the inner region 25.

In an embodiment, at least one protrusion 45 may be configured such that its upper surface forms an annulus extending around the outer region 24 of the support section 22, namely encompassing the inner region 25. This may facilitate manufacture.

In an embodiment, a protrusion 45 may be configured such that the upper surface substantially forms an annulus extending (e.g., a series of concentric rings) around the outer region 24 of the support section 22 but is divided into a plurality of sections. This provides a plurality of openings to help ensure easy flow of gas between the two sides of the protrusion 45. This may ensure that local reductions in the under pressure used for vacuum clamping a substrate W to the support section 22 is minimized.

As is discussed further below, in an embodiment, the protrusions 45 may be provided distributed over the entire upper surface of the support section 22, namely in both the outer region 24 and the inner region 25. In such an arrangement, the protrusions 45 may be configured as a series of concentric rings, which may each have a plurality of openings as discussed above. In such an arrangement, the burls 20 may be arranged between adjacent concentric rings of protrusions 45. Provision of such an arrangement may facilitate manufacture of the support section 22.

In an embodiment, at least one protrusion 45 may be configured such that the separation between the upper surface of the protrusion 45 and the lower surface of a substrate W supported by the support section 22 is 10 μm or less. In such an embodiment, the separation of the base surface of the support section 22 from the lower surface of the substrate W may be 150 μm. Alternatively, the separation between the base surface of the support section 22 and the lower surface of the substrate W may be larger, for example 400 μm or more. In an embodiment having a plurality of protrusions 45, approximately 50% of the area of the lower surface of a substrate W may be directly above a protrusion 45. Accordingly, the thermal conductivity between the support section 22 and the substrate W may be improved. In particular, the thermal transfer may be increased by a factor of approximately 2 to 3, all other factors remaining constant.

Figure 20:
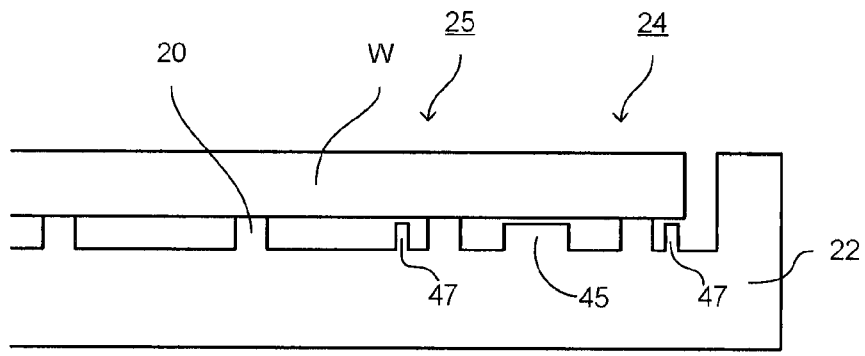

In an embodiment, as depicted in FIG. 20, the position and size of the protrusion 45 may be selected such that, during use of the support table in an immersion lithographic apparatus, a thin layer of immersion fluid is arranged between the upper surface of the protrusion 45 and the lower surface of the substrate W.

This thin layer of immersion fluid may significantly reduce the resistance to heat transfer between the support section 22 and the substrate W without providing a physical restraint on the substrate W such as would be the case if the protrusion 45 were in physical contact directly with the substrate W.

In an embodiment, the protrusion 45 may be located between two seals 47 that are arranged to prevent or limit the transfer of immersion fluid under the substrate W from the edge of the substrate W towards the center of the substrate W. The two seals 47 may be formed from annular protrusions that extend to a position sufficiently close to the underside of the substrate as to provide the desired sealing functionality. In an embodiment, the protrusion 45 is not annular so as to help ensure that the pressure in the region between the two seals 47 is uniform. For example the protrusion 45 may be arranged in a peripheral (e.g., circumferential) path that has one or more openings between parts of the protrusion to connect the region between the innermost seal 47 and the protrusion 45 to the region between the outermost seal 47 and the protrusion 45. In this location, for example, during use, immersion fluid may be drawn towards the protrusion 45 by the under pressure provided around the burls 20 that is used to vacuum clamp the substrate W to the support section 22. The height of the protrusion 45 relative to the lower surface of the substrate W may be selected such that the gap between the top of the protrusion 45 and the lower surface of the substrate W is such that the immersion fluid is retained in the gap. In particular, the size of the gap may be selected such that the capillary pressure holding the immersion fluid in the gap is greater than the difference in gas pressure across the protrusion 45 that may be caused by the under pressure used to vacuum clamp the substrate W to the support section 22.

In an embodiment, a fluid other than a fluid that has been provided for the performance of immersion lithography may be provided to the protrusion 45. Accordingly, a supply of an appropriately selected fluid may be provided to the protrusion 45.

In an embodiment, a difference in the resistance to transferring heat between the support section 22 and the substrate W across the support section 22 may be effected by control of the upper surface of the burls 20, namely the surface that is in contact with the substrate W. For example, as described in FIG. 21, the burls 20 may be configured such that the surface roughness of the upper surfaces of the burls 20 is less for burls in the outer region 24 than in the inner region 25.

This difference in surface roughness may be achieved, for example, by utilizing improved polishing for the upper surfaces of the burls 20 in the outer region 24 in comparison with the burls 20 in the inner region 25. Alternatively or additionally, surface roughness may be induced in the upper surface of the burls 20 in the inner region 25, for example by scratching or etching.

The difference in surface roughness of the upper surfaces of the burls 20 across the support section 22 may result in a variation of the deformation of the burls 20 caused by the vacuum clamping of the substrate W to the support section 22, similar to the variation in deformation caused by a distribution of the total area of burls 20 in contact with the lower surface of the substrate W as discussed above. Accordingly, as described above, this may be partially or completely compensated by provision of a vacuum clamping arrangement as described above in which there is a distribution across the substrate W of the under pressure used to provide the vacuum clamping.

In an embodiment, a difference in the resistance to transferring heat between the support section 22 and the substrate W across the support section 22 may be effected by use of different gases between the support section 22 and the substrate W in different regions. In particular, in an embodiment, a higher thermal conductivity gas is provided to the space between the outer region 24 of the support section 22 and the outer region 26 of the substrate W than is provided to the space between the inner region 25 of the support section 22 and the inner region 27 of the substrate W. In an embodiment, the relatively high thermal conductivity gas comprises He (helium), $H_2$ (hydrogen), a mixture of He and $H_2$, a gas comprising water vapor, another gas or any combination of the above. In an embodiment, the gas may comprise any of the above and/or at least one of the following: air, argon and/or nitrogen.

Figure 25:
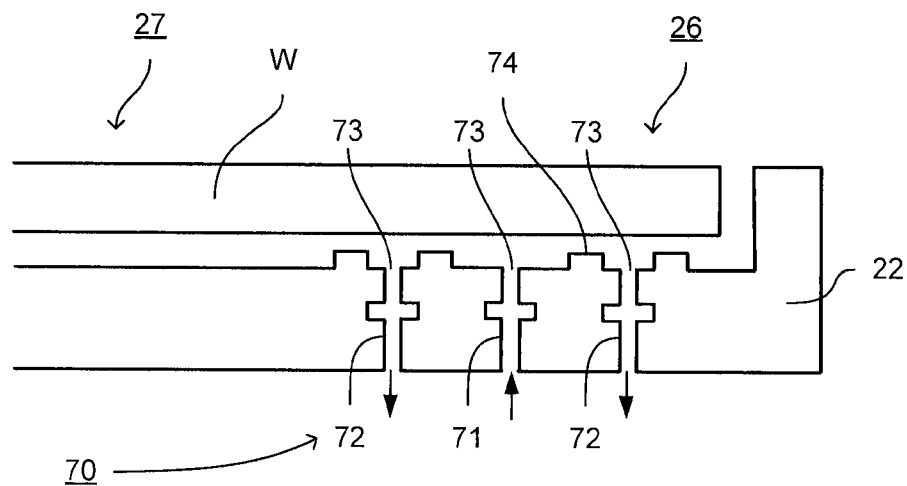
FIG. 25 depicts, in cross-section, a detail of a support table according to an embodiment of the invention.

FIG. 25 depicts an embodiment comprising a gas handling system 70 to provide the relatively high thermal conductivity gas to the space between the support section 22 and the outer region 26 of the substrate W. For clarity, the burls supporting the substrate W are not shown.

The gas may be supplied to the space by a supply line 71 and withdrawn by gas extraction lines 72 that are provided on either side of the space defined by the outer region 26 of the substrate W. Accordingly, the relatively high thermal conductivity gas may be substantially retained in the space between the support section 22 and the outer region 26 of the substrate W. Such an arrangement may provide higher thermal conductivity between the support section 22 and the outer region 26 of the substrate W than between the support section 22 and the inner region 27 of the substrate W.

In an embodiment, the gas supply line 71 and the gas extraction lines 72 are each connected to a plurality of respective ports 73 in the upper surface of the support section 22. Each gas supply line 71 or gas extraction line 72 may be connected to a plurality of ports 73. In particular, the gas extraction lines 72 may be connected to a plurality of ports 73 provided along the boundary of the space corresponding to the outer region 26 of the substrate W.

In an embodiment, flow resisting structures 74 may be provided on either side of the ports 73 connected to the gas extraction lines 72 in order to restrict the flow of gas to or from the space to which the high thermal conductivity gas is provided.

As depicted in FIG. 25, a gas handling system 70 may be provided in order to supply the relatively high thermal conductivity gas to the space between the support section and the outer region 26 of the substrate. In an embodiment, a second gas supply system, that may be similar, may be provided to supply a different gas to the space between the support section 22 and the inner region 27 of the substrate, namely a gas having a lower thermal conductivity than the gas provided to the space between the support section 22 and the outer region 26 of the substrate W. This may facilitate control of the gas in the space between the support section 22 and the substrate W in the inner and outer regions 27, 26. Both gases may have a higher thermal conductivity than would be the case if neither gas supply system were provided or operated.

In the embodiments discussed above, there are provided a variety of ways in which the heat transfer to or from the substrate per unit area of the substrate as a result of the operation of the conditioning system can be improved in a particular region. In particular, the heat transfer to or from the substrate per unit area of the substrate as a result of the operation of the conditioning system may be arranged to be greater in a first region of the substrate, adjacent to an edge of the substrate, than it is in a second region of the substrate, at the center of the substrate. Combinations of these arrangements may be used.

Furthermore, in the absence of manufacturing difficulties and/or constraints, the arrangements discussed above to improve the heat transfer to or from the substrate as a result of the operation of the conditioning system may be applied all over the support section with a view to reducing or minimizing a temperature change of the support section and/or the substrate. In such an embodiment, it may be possible to reduce a temperature change to an extent such that an undesirable effect is reduced to an acceptable level. Therefore, in embodiments, one or more of the arrangements described above to improve the heat transfer to or from the first region of the substrate may be applied all over the support section, namely in both the inner and outer regions 25, 24 of the support section 22.

Similarly, in an embodiment, one or more of the above-described arrangements to improve the heat transfer to or from the substrate may be applied to the region of the support section corresponding to the second region of the substrate, namely the inner region of the substrate. For example, a first arrangement to improve the heat transfer to or from the substrate may be utilized in respect of the first region of the substrate but it may not be practical or economic to utilize it all over the support section. In that case, a different one of the above-described arrangements to improve the heat transfer to or from the substrate may be utilized in respect of the second region of the substrate. The second arrangement may not, for example, improve the heat transfer to or from the substrate to the same extent as the first arrangement utilized in respect of the first region of the substrate but may be simpler to provide and/or more cost-effective.

In an embodiment, which may be combined with any of the above described embodiments, the support section may be configured to reduce the effect of increased sensitivity to thermal variation of the outer region of a substrate, adjacent an edge of the substrate, in comparison to the inner region of the substrate, at the center of the substrate.

In an embodiment, this may be achieved by configuring the support section to include an upper surface comprising a base surface that is substantially parallel to the lower surface of the substrate to be supported, and a plurality of burls protruding from the base surface. The support section may be configured such that only the upper surface of the burls is in contact with a substrate when it is supported by the support section. In an embodiment, the burls are further configured such that the stiffness of the burls in a direction parallel to the upper face of the support section is greater for the burls in contact with the outer region 26 of the substrate than for burls in contact with the inner region 27 of the substrate W. This increased stiffness of each of the burls in the direction parallel to the major face of the substrate may be selected in order to compensate for the fact that a region of the substrate at an edge of the substrate does not have burls in contact with the substrate extending in every direction around the region due to the finite extent of the substrate, as discussed above.

In an embodiment, the burls may be configured such that the stiffness of the burls in a direction perpendicular to the upper face of the support section is substantially the same for the burls in contact with both the outer region of the substrate and the inner region of the substrate notwithstanding the fact that the stiffness is different in a direction parallel to the upper face of the support section. This may reduce local height variations of the substrate when it is clamped, for example vacuum clamped, to the support section. During such clamping, the substrate will exert a force on each of the burls in the direction perpendicular to the upper face of the support section, resulting in a small deformation that is proportional to the stiffness of the burl in this direction.

In an embodiment, the burls in contact with the outer region of the substrate may be configured such that the direction in which the stiffness of the burls is greater than the burls in contact with the inner region of the substrate is a radial direction. By radial direction is meant a direction away from the center of the substrate, which may generally be round. However, in the case of a non-round substrate, the direction would still be away from the center of the substrate. Therefore, this direction is different for burls in contact with different parts of the outer region of the substrate.

Figure 23:
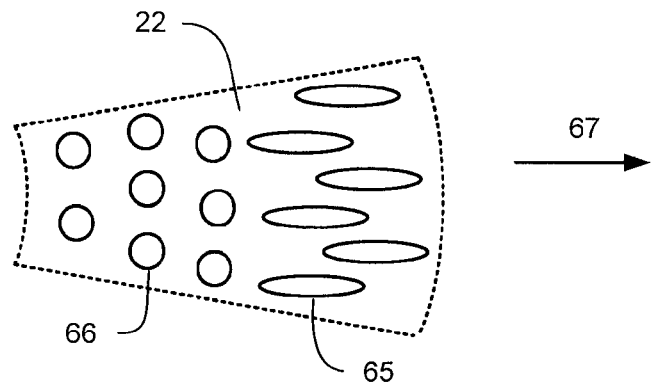
FIG. 23 depicts, in plan view, part of a support table according to an embodiment of the invention.

FIG. 23 depicts, in plan view, a plurality of burls on a support section 22 according to an embodiment. As shown, a plurality of burls 65 of a first type are provided to be in contact with the first region of a substrate W and a plurality of burls 66 of a second type are provided to be in contact with the second region of the substrate W.

The burls 65 of the first type have a cross-section (in a plane parallel to the upper surface of the support section 22) that is elongate in a radial direction 67, namely away from the center of the substrate W. On the other hand, the burls 66 of the second type have a conventional circular cross-section. Consequently, the burls 65 of the first type may be stiffer in the radial direction 67 than the burls 66 of the second type, even if all of the burls 65, 66 have the same cross-sectional area. In an embodiment, the burls 65, 66 of the two types may be configured to have substantially the same cross-sectional area to help ensure that all of the burls 65, 66 have substantially the same stiffness in a direction perpendicular to the base surface of the support section 22.

Figure 21:
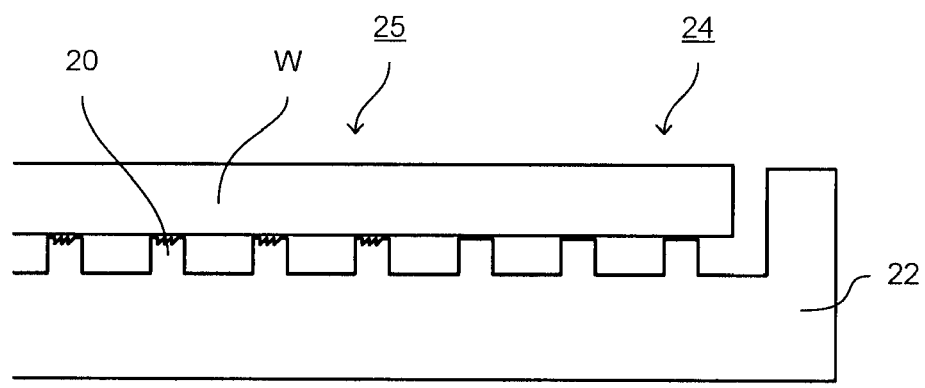

Alternatively or additionally, a similar effect may be provided by configuring the support section 22 such that the burls 20 in the outer region 24 of the support section 22 have an upper surface with a lower surface roughness than the burls 20 in the inner region 25 of the support section 22, as depicted in FIG. 21 and discussed above. Reducing the surface roughness increases the area of the burl in contact with the substrate, in turn increasing the stiffness of the local contact between the burl and the substrate. Accordingly, such an arrangement may provide both the benefit of providing increased heat transfer between the substrate W and the support section 22 in the outer region 26 of the substrate and reducing the effect of a temperature fluctuation in the outer region 26 of the substrate W in comparison with the inner region 27 of the substrate W.

Figure 24:
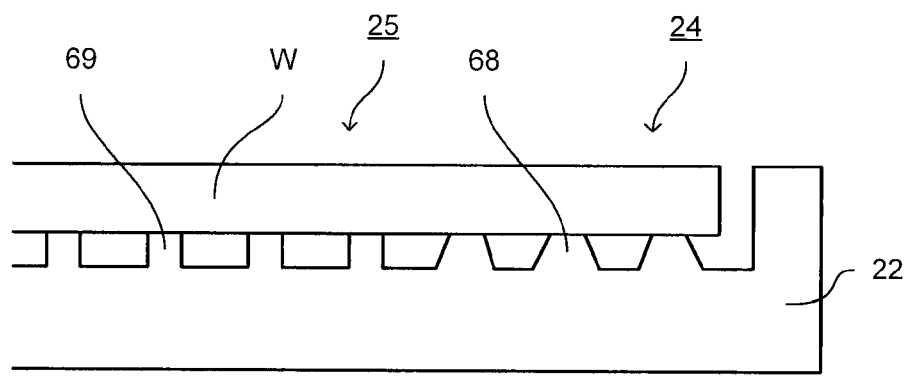
FIG. 24 depicts, in cross-section, a part of a support table according to an embodiment of the invention.

Alternatively or additionally, in an embodiment, depicted in FIG. 24, the burls 68 in contact with the outer region 26 of the substrate W, namely those in the outer region 24 of the support section 22, may be tapered such that the cross-sectional area of the burls 68 decreases in a direction away from the base surface of the support section 22. For example, the burls 68 may be frustro-conical in shape. By use of such a configuration, the burls 68 in contact with the outer region 26 of the substrate W may be configured to have substantially the same stiffness in a direction perpendicular to the base surface of the support section 22 as burls 69 in contact with the inner region 27 of the substrate W, which may for example have a conventional shape, but may have greater stiffness in a direction parallel to the base surface of the support section. In an embodiment, the burls 69 in contact with the inner region 27 of the substrate W may be substantially cylindrical in shape.

A problem for conditioning systems used in lithographic apparatus may be the response time. It may, for example, be desirable to minimize or reduce variations of the temperature of the substrate. However, it may not be possible to detect these variations directly. Accordingly, it may be necessary to monitor the temperature of the support section 22 of the support table WT supporting the substrate W. If, for example, it is measured that the temperature of the support section 22 is dropping, it may be determined this is caused by a drop in the temperature of the substrate W and the conditioning system 21 may be controlled appropriately in order to provide heat to raise the temperature.

However, there is a delay between the temperature of the substrate W dropping and the consequent dropping of the temperature of the support section 22.

Alternatively or additionally, a delay may be introduced by the conditioning system 21 itself. In particular, once it has been determined that heat should be provided by the conditioning system 21 or removed by the conditioning system 21, there may be a delay before the heat transfer is effected. For example, in a conditioning system 21 utilizing a flow of a conditioning fluid through a channel within the support section 22, there will be a delay between the point at which it is determined that conditioning is required and the time at which appropriately heated or cooled conditioning fluid passes through the support table WT. Furthermore, a further delay may occur due to the time taken for the heat to transfer between the support section 22 of the support table WT and the substrate W itself.

Such delays in the response between the temperature change of the substrate and heat being provided to or removed from the substrate may result in greater temperature fluctuations of the substrate.

In an embodiment, as depicted in FIG. 8, the conditioning system 21 may be controlled by a controller 31 that may provide improved control of the conditioning system 21. In the arrangement depicted, the lithographic apparatus further includes a position measurement system 50, configured to measure the position of the support table WT within the lithographic apparatus. This position measurement system 50 may be a position measurement system that is provided in order to control the actuator system used to move the support table WT. Alternatively, the position measurement system 50 used to control the conditioning system may be a separate position measurement system that is not used as part of the control of the movement of the support table WT.

The controller 31 may be configured to control the conditioning system 21 to provide heat energy to and/or remove heat energy from the support table WT based on information that includes the measured position of the support table WT. For example, the controller may be pre-programmed such that at specific positions of the support table WT, a certain amount of heat energy is provided to or removed from the support table WT by the conditioning system.

For such an arrangement, the controller 31 may include a memory 51 in which to store data corresponding to an amount of heat expected to be required to be supplied and/or removed by the conditioning system 21 for one or more locations of the support table WT.

Accordingly, it may be known that when the support table WT is in a particular location a given amount of cooling will occur at the substrate W (for example caused by the operation of an immersion fluid handling system). Therefore, the controller 31 may be configured to supply an appropriate amount of heat energy to the support table WT in order to compensate for the cooling.

The system may therefore be configured such that the conditioning system 21 can provide heat energy to the support table WT and/or remove heat energy from the support table to provide the desired heat transfer between it and the substrate W without waiting for a measured temperature response, of, for example, the support table WT.

In an embodiment, the memory 51 may include data corresponding to the expected movements of the support table WT during the processing of a substrate W and the amount of heat energy expected to be supplied and or removed by the conditioning system 21 during the expected movements. Based on this data, the controller 31 may be better able to predict the desired heating and/or cooling of the support table WT.

In particular, for example, a problem of overshoot may be avoided. For example, the data within the memory 51 of the controller 31 may permit the controller 31 to stop supplying heat from the conditioning system 21 to the support table WT to compensate for cooling caused by an immersion fluid handling system shortly before the support table WT is moved away from the immersion fluid handling system. Due to the delay in heat transfer from the conditioning system 21 through the support table WT to the substrate W, during the final stages of operation of the fluid handling system (which may cool the substrate W), heat will continue to be supplied to the substrate W. However, with appropriately arranged timing, at the point at which the cooling effect ceases on the substrate W, heat may cease to be substantially provided to the substrate W from the conditioning system 21 via the support table WT. In contrast, without such a predictive system, heat would be continued to be provided to the substrate table WT until a rise in the temperature of the substrate table is measured, resulting from an earlier rise in the temperature of the substrate W following the end of cooling. Thereafter heat would continue to be supplied to the substrate W from the substrate table WT until the temperature of the substrate table WT and the substrate W equalize. This may result in an overshoot of the temperature of the substrate W.

Although the controller 31 may be arranged primarily to be predictive (i.e. using feedforward) based on the position of the support table WT, one or more temperature sensors 52 may be provided, for example, within the support section 22 of the support table WT, as depicted in FIG. 8. Accordingly, the controller 31 may utilize the information from the temperature sensor 52 in order to refine the control of the conditioning system (i.e. may include a feedback loop).

For example, the controller 31 may modify the commands to the conditioning system 21 to supply and/or remove heat energy from the support section 22 of the support table WT using the measured temperature at each instant. Alternatively or additionally, the controller 31 may use historical data measured by the temperature sensor 52 in order to update the information in the memory 51 used for control of the conditioning system 30 during the processing of a subsequent substrate W.

A plurality of temperature sensors 52 may be provided, for example, distributed across the support section 22 of the support table WT and/or used to measure the temperature of the substrate W directly. Furthermore, the conditioning system 21 may be configured such that the amount of heat supplied to and/or removed from a plurality of different regions of the support table WT can be independently controlled by the controller 31 in response to the position of the support table WT.

In an embodiment, the controller 31 may be configured such that, when the support table is provided to a location within the lithographic apparatus for a substrate W to be loaded to the support table WT, the controller 31 may control the conditioning system 21 to start to supply heat energy to and/or remove heat energy from the support table WT before the substrate W is loaded to the support table WT. The controller 31 may be configured such that the conditioning system 21 starts to supply an amount of heat energy to and/or remove heat energy from the support table WT that is expected to be required for the substrate W. This may avoid or reduce the delay resulting from heat having to pass through the support table WT to transfer between the conditioning system 21 and the substrate W. Accordingly, at the time at which a substrate that has just been loaded to the support table WT encounters a heat load, the requisite heat flow is provided to or from the substrate W by the support section 22 of the support table WT as a result of the heat flow provided to or from the conditioning system 21 to the support section 22 of the support table WT before the substrate W was loaded to the support table WT.

In an embodiment, the amount of heat provided to and/or removed from the support table WT by the conditioning system 21 before the substrate is loaded to the support table may be based on a measured temperature of the substrate W.

Figure 22:
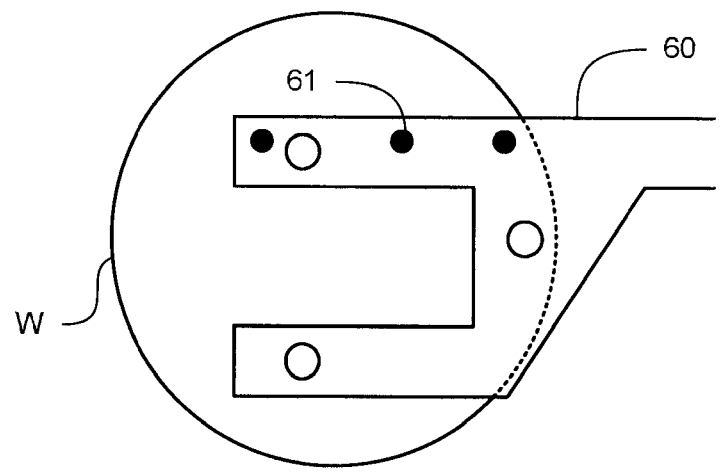
FIG. 22 depicts a substrate handling apparatus that may be used in an embodiment of the invention.

In an embodiment as depicted in FIG. 22, the measurement of the temperature of the substrate W prior to it being loaded to the support table WT may be measured while the substrate W is being handled by a substrate handling apparatus 60. Accordingly, the temperature measurement of the substrate W may be provided to the controller 31 in sufficient time for it to control the heat energy provided to and/or removed from the support section 22 of the support table WT by the conditioning system 21, as discussed above.

In an embodiment, the substrate handling apparatus 60 may include one or more temperature sensors 61. For example, the one or more temperature sensors 61 may contact the substrate W when it is held by the substrate handling apparatus 60.

Alternatively or additionally, a non-contact temperature sensor, such as an infrared camera may be arranged such that it can measure the temperature of the substrate W while it is handled by the substrate handling apparatus 60. For example, such a non-contact temperature sensor may be mounted to the substrate handling apparatus 60. Alternatively, the non-contact temperature sensor may be mounted to another part of the lithographic apparatus but may be arranged such that the substrate handling apparatus 60 moves the substrate W past the non-contact temperature sensor during the process of loading the substrate W to the support table WT.

Regardless of the nature of the temperature sensor, the system may be configured to utilize a single temperature measurement for the substrate W.

Alternatively, a plurality of temperature measurements may be made across the substrate W. This may be beneficially used if the conditioning system 21 is configured to independently control the heat energy provided to and/or removed from different regions of the support table WT. In that case, each part of the conditioning system 21 may be independently controlled based on the initial temperature of the substrate W.

If a plurality of separate temperature sensors 61 are provided, a separate temperature sensor 61 may be provided corresponding to each section of the conditioning system 21. Alternatively, if, for example, an infrared camera is utilized, an image of the entire substrate W may be obtained and a plurality of sections of the image may be separately analyzed in order to provide the requisite control for each section of the conditioning system 21.

In an embodiment, there is provided a support table for a lithographic apparatus, the support table comprising: a support section, configured to support a lower surface of a substrate on an upper face thereof; and a conditioning system, configured to supply heat energy to and/or remove heat energy from the support section; wherein, when a substrate is supported by the support section, it is thermally coupled to the support section such that, when the conditioning system supplies heat energy to or removes heat energy from the support section, energy in turn transfers from the support section to the substrate or to the support section from the substrate, respectively; and the support section, the conditioning system, or both, is configured such that the heat transfer to or from the substrate per unit area of the substrate as a result of the operation of the conditioning system is greater in a first region of the substrate that is adjacent the edge of the substrate than it is in a second region of the substrate that is at the center of the substrate.

In an embodiment, the conditioning system comprises a heater system, configured such that it can provide to the support section more heat energy per unit area of the upper face of the support section in a first region of the support section, thermally coupled to the first region of the substrate, than in a second region of the support section, thermally coupled to the second region of the substrate. In an embodiment, the heater system comprises a plurality of independently controllable heater units; and at least one heater unit is provided in the first region of the support section and at least one other heater unit is provided in the second region of the support section. In an embodiment, the heater system comprises an elongate electric heating element arranged such that there is a greater length of heating element per unit area of the upper face of the support section in the first region of the support section than in the second region of the support section. In an embodiment, the conditioning system comprises a channel within the support section, configured to convey a conditioning fluid; and the channel is configured to pass through a first region of the support section, thermally coupled to the first region of the substrate, and a second region of the support section, thermally coupled to the second region of the substrate. In an embodiment, the cross-sectional area of the channel is smaller in the first region of the support section than in the second region of the support section. In an embodiment, the surface roughness of the channel is greater in the first region of the support section than in the second region of the support section. In an embodiment, the channel has a greater number of corners and/or has sharper corners in the first region of the support section than in the second region of the support section. In an embodiment, the perimeter of the cross-section of the channel is greater in the first region of the support section than in the second region of the support section. In an embodiment, the separation between a first section of the channel and an adjacent second section of the channel is less in the first region of the support section than in the second region of the support section. In an embodiment, the total volume of the channel corresponding to a given area of the upper face of the support section is greater in the first region of the support section than in the second region of the support section. In an embodiment, the support table further comprises a channel heater configured to supply heat to the conditioning fluid in the channel. In an embodiment, the channel heater is configured to supply heat to a greater proportion of the surface area of the channel in the first region of the support section than in the second region of the support section. In an embodiment, the channel heater comprises a plurality of heaters and the spatial density of the plurality of heaters is larger in the first region of the support section than in the second region of the support section. In an embodiment, the conditioning system is configured such that conditioning fluid is provided to an end of the channel located within the first region of the support section and extracted from an end of the channel located within the second region of the support section. In an embodiment, the upper face of the support section comprises a base surface, configured to be substantially parallel to a lower surface of a substrate supported on the support section, and a plurality of burls, protruding from the surface, wherein, when a substrate is supported by the support section, it is only in contact with the upper surface of the burls. In an embodiment, the support section is configured such that the total area of burls in contact with a substrate that is supported by the support section per unit area of the substrate is greater in the first region of the substrate than in the second region of the substrate. In an embodiment, the upper surface of each of the burls in contact with the first region of a substrate supported by the support section is larger than the upper surface of each of the burls in contact with the second region of the substrate. In an embodiment, the number of burls in contact with a substrate supported by the support section per unit area of the substrate is larger in the first region of the substrate than in the second region of the substrate. In an embodiment, the support section is configured such that the separation between the base surface and a substrate supported by the support section is smaller for the first region of the substrate than for the second region of the substrate. In an embodiment, at least one burl arranged to be in contact with the first region of a substrate supported by the support section comprises a first portion that includes an upper surface configured to contact the substrate and a second portion that protrudes from the base surface less than the first portion. In an embodiment, the upper surface of the support section further comprises a projection arranged in a first region of the upper face that is configured to be thermally coupled to the first region of a substrate supported by the support section, the projection configured such that it protrudes away from the base surface less than the burls. In an embodiment, the projection is configured such that it forms an annulus that surrounds a second region of the support section that is arranged to be thermally coupled to the second region of a substrate supported by the support section. In an embodiment, the projection is configured such that, in use, a layer of fluid is retained on the projection and in contact with a substrate supported on the support section. In an embodiment, the upper surface of burls in contact with the first region of the substrate supported by the support section is configured to have a lower surface roughness than the upper surface of burls in contact with the second region of the substrate. In an embodiment, the support table further comprises a gas handling system configured to provide a gas to a space between the support section and the first region of the substrate that has higher thermal conductivity than a gas in the space between the support section and the second region of the substrate. In an embodiment, the gas provided to the space between the support section and the first region of the substrate comprises at least one selected from the following: He, $H_2$ and/or water vapor.

In an embodiment, there is provided a support table for a lithographic apparatus, the support table comprising: a support section, configured to support a lower surface of a substrate on an upper surface of the support section, the upper surface of the support section comprising a base surface, configured to be substantially parallel to the lower surface of the substrate when supported on the support section, and comprising a plurality of burls protruding from the base surface and arranged such that, when the substrate is supported by the support section, the substrate is only in contact with the upper surface of the burls, wherein the burls are configured such that the stiffness of the burls in a direction parallel to the upper surface of the support section is greater for burls in contact with a first region of the substrate that is adjacent to an edge of the substrate than for burls in contact with a second region of the substrate that is at the center of the substrate, and the stiffness of the burls in a direction perpendicular to the upper face of the support section is substantially the same for burls in contact with the first and second regions of the substrate.

In an embodiment, the stiffness of the burls is compared for a radial direction oriented away from the center of the substrate. In an embodiment, the burls in contact with the first region of the substrate have a cross section such that their length in a radial direction, away from the center of the substrate, is greater than their width in a tangential direction, perpendicular to the radial direction. In an embodiment, a cross sectional area of the burls in contact with the first and second regions of the substrate is the same. In an embodiment, the burls in contact with the first region of the substrate have a decreasing cross sectional area in a direction away from the base surface of the support section. In an embodiment, the upper surfaces of burls in contact with the first region of the substrate have a lower surface roughness than the upper surfaces of burls in contact with the second region of the substrate.

In an embodiment, there is provided a lithographic apparatus comprising a support table as described herein.

In an embodiment, there is provided a device manufacturing method, comprising transferring a pattern from a patterning device to a substrate using a lithographic apparatus as described herein.

In an embodiment, there is provided a lithographic apparatus, comprising: a support table, configured to support a substrate; a conditioning system, configured to supply heat energy to and/or remove heat energy from the support table; a position measurement system, configured to measure the position of the support table within the lithographic apparatus; and a controller, configured to control the conditioning system to supply heat energy to and/or remove heat energy from the support table based on information including the measured position of the support table.

In an embodiment, the controller comprises a memory, in which is stored data corresponding to an amount of heat energy expected to be required to be supplied and/or removed by the conditioning system for a particular location of the support table; and the controller is configured to control the conditioning system based on the data. In an embodiment, the memory further comprises data corresponding to the expected movements of the support table within the lithographic apparatus during processing of a substrate and the amount of heat energy expected to be supplied and/or removed by the conditioning system during the expected movements. In an embodiment, the amount of heat expected to be required to be supplied to and/or removed by the conditioning system is based on expected heat loading on the support table and a substrate supported by the substrate at each location of the support table and/or during each movement, offset by an expected delay for heat energy to transfer between the conditioning system and the substrate and/or substrate table. In an embodiment, the lithographic apparatus further comprises a temperature sensor to measure the temperature of at least part of the support table and/or at least part of a substrate supported on the support table, wherein the controller is configured such that it controls the conditioning system based on information further comprising a temperature measurement from the temperature sensor. In an embodiment, the conditioning system is configured such that the amount of heat supplied to and/or removed from a plurality of different regions of the support table can be independently controlled by the controller. In an embodiment, the controller is configured such that, when the support table is at a location for a substrate to be loaded to the support table, it controls the conditioning system to start to supply heat energy to and/or remove heat energy from the support table that is expected to be required before the substrate is loaded to the support table.

In an embodiment, there is provided a lithographic apparatus, comprising: a support table, configured to support a substrate; a conditioning system, configured to supply heat energy to and/or remove heat energy from the support table; and a controller, configured to control the conditioning system to supply heat energy and/or remove heat energy from the support table, the controller configured such that, when the support table is at a location for a substrate to be loaded to the support table, it controls the conditioning system to start to supply heat energy to and/or remove heat energy from the support table that is expected to be required before the substrate is loaded to the support table.

In an embodiment, the lithographic apparatus further comprises: a substrate handling apparatus, configured to load a substrate to the substrate table; and a temperature sensor, configured to measure the temperature of at least a part of a substrate being handled by the substrate handling apparatus, wherein the controller uses the measured temperature of the substrate to determine the heat energy expected to be required to be supplied to and/or removed from the support table. In an embodiment, the temperature sensor is configured to measure the temperature of a plurality of parts of the substrate.

In an embodiment, there is provided a device manufacturing method, comprising using a lithographic apparatus to transfer a pattern from a patterning device to a substrate, wherein the lithographic apparatus comprises a support table configured to support the substrate, a conditioning system configured to supply heat energy to and/or remove heat energy from the support table, and a position measurement system configured to measure the position of the support table within the lithographic apparatus, the method comprising controlling the conditioning system to supply heat energy to and/or remove heat energy from the support table based on information including the measured position of the support table.

In an embodiment, there is provided a device manufacturing method, comprising using a lithographic apparatus to transfer a pattern from a patterning device to a substrate, wherein the lithographic apparatus comprises a support table configured to support the substrate, and a conditioning system configured to supply heat energy to and/or remove heat energy from the support table, the method comprising controlling the conditioning system to supply heat energy to and/or remove heat energy from the support table that is expected to be required before the substrate is loaded to the support table.

As will be appreciated, any of the above described features can be used with any other feature and it is not only those combinations explicitly described which are covered in this application. For example, an embodiment of the invention could be applied to the embodiments of FIGS. 2 to 4. Furthermore, discussions herein of heating or heaters should be understood to encompass cooling or coolers, respectively.

Furthermore, although the invention has been described above in the context of an immersion lithographic apparatus for convenience, it will be appreciated that the invention may be used in conjunction with any form of lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A support table for a lithographic apparatus, the support table comprising:
   a support section, configured to support a lower surface of a substrate on an upper face thereof;
   a conditioning system, configured to supply heat energy to and/or remove heat energy from the support section; and
   a control system structured or programmed to control the conditioning system to supply the heat energy to and/or remove the heat energy from the support section;
   wherein, when a substrate is supported by the support section, it is thermally coupled to the support section such that, when the conditioning system supplies heat energy to or removes heat energy from the support section, energy in turn transfers from the support section to the substrate or to the support section from the substrate, respectively,
   wherein the support section, the conditioning system, or both, has a first portion thereof in a first region of the substrate that is adjacent the edge of the substrate and is on opposite sides of the center of the substrate and a second portion thereof in a second region of the substrate that is at the center of the substrate,
   wherein (i) the first portion is structurally different than the second portion such that, for a common heat transfer energy input to the first and second portions, the heat transfer to or from the substrate per unit area of the substrate as a result of the operation of the conditioning system is greater in the first region for a given heat load and/or temperature change than it is in the second region for the given heat load and/or temperature change, or (ii) the control system is further structured or programmed to control the conditioning system such that the heat transfer to or from the substrate per unit area of the substrate as a result of the operation of the conditioning system is greater in the first region for a given heat load and/or temperature change than it is in the second region for the given heat load and/or temperature change, or (iii) both (i) and (ii), and
   wherein the control system is configured to control the conditioning system to provide the heat transfer to or from the substrate per unit area of the substrate that is greater in the first region than it is in the second region at least during a radiation beam exposure process applied to the substrate.

2. The support table according to claim 1, wherein the conditioning system comprises a heater system, configured such that it can provide to the support section more heat energy per unit area of the upper face of the support section in a first region of the support section, thermally coupled to the first region of the substrate, than in a second region of the support section, thermally coupled to the second region of the substrate.

3. The support table according to claim 2, wherein the heater system comprises a plurality of independently controllable heater units; and
at least one heater unit is provided in the first region of the support section and at least one other heater unit is provided in the second, region of the support section.

4. The support table according to claim 2, wherein the heater system comprises an elongate electric heating element having a first portion thereof in the first region of the support section and a second portion thereof in the second region of the support section, and the first and second portions of the elongate electric heating element are arranged such that there is a greater length of heating element per unit area of the upper face of the support section in the first region of the support section than in the second region of the support section.

5. The support table according to claim 1, wherein the conditioning system comprises a channel within the support section, configured to convey a conditioning fluid; and the channel is configured to pass through a first region of the support section, thermally coupled to the first region of the substrate, and a second region of the support section, thermally coupled to the second region of the substrate.

6. The support table according to claim 5, wherein the cross-sectional area of the channel is smaller in the first region of the support section than in the second region of the support section.

7. The support table according to claim 5, wherein the surface roughness of the channel is greater in the first region of the support section than in the second region of the support section.

8. The support table according to claim 5, wherein the channel has a greater number of corners and/or has sharper corners in the first region of the support section than in the second region of the support section.

9. The support table according to claim 5, wherein the perimeter of the cross-section of the channel is greater in the first region of the support section than in the second region of the support section.

10. The support table according to claim 5, wherein the separation between a first section of the channel and an adjacent second section of the channel is less in the first region of the support section than in the second region of the support section.

11. The support table according to claim 5, wherein the total volume of the channel corresponding to a given area of the upper face of the support section is greater in the first region of the support section than in the second region of the support section.

12. The support table according to claim 5, further comprising a channel heater configured to supply heat to the conditioning fluid in the channel.

13. The support table according to claim 5, wherein the conditioning system is configured such that conditioning fluid is provided to an end of the channel located within the first region of the support section and extracted from an end of the channel located within the second region of the support section.

14. The support table according to claim 1, wherein the upper face of the support section comprises a base surface, configured to be substantially parallel to a lower surface of a substrate supported on the support section, and a plurality of burls, protruding from the surface, wherein, when a substrate is supported by the support section, it is only in contact with the upper surface of the burls, wherein the support section is configured such that the total area of burls in contact with a substrate that is supported by the support section per unit area of the substrate is greater in the first region of the substrate than in the second region of the substrate.

15. The support table according to claim 1, further comprising a gas handling system configured to provide a gas to a space between the support section and the first region of the substrate that has higher thermal conductivity than a gas in the space between the support section and the second region of the substrate.

16. The support table according to claim 15, wherein the gas provided to the space between the support section and the first region of the substrate comprises at least one selected from the following: He, $H_2$ and/or water vapor.

17. A device manufacturing method, comprising using a lithographic apparatus to transfer a pattern from a patterning device to a substrate, wherein the lithographic apparatus comprises a support table configured to support the substrate, and a conditioning system configured to supply heat energy to and/or remove heat energy from the support table, wherein the conditioning system has a first portion thereof in a first region of the substrate that is adjacent the edge of the substrate and is on opposite sides of the center of the substrate and a second portion thereof in a second region of the substrate, the method comprising:
at least during a pattern transfer process in the lithographic apparatus to transfer the pattern to the substrate, providing heat transfer to or from the substrate per unit area of the substrate as a result of the operation of the conditioning system that is greater in the first region for a given heat load and/or temperature than it is in the second region for the given heat load and/or temperature change.

18. The method of claim 17, wherein providing heat transfer to or from the substrate per unit area of the substrate that is greater in the first region than it is in the second region is as a result of the first portion being structurally different than the second portion.

19. The method of claim 17, wherein providing heat transfer to or from the substrate per unit area of the substrate that is greater in the first region than it is in the second region is due to a control system programmed to control the conditioning system to provide different heat transfer at the first region compared to the second region.

20. A lithographic apparatus, comprising:
a projection system configured to project a beam of radiation onto a radiation-sensitive substrate; and
a support table comprising:
a support section, configured to support a lower surface of the substrate on an upper face thereof;
a conditioning system, configured to supply heat energy to and/or remove heat energy from the support section; and
a control system structured or programmed to control the conditioning system to supply the heat energy to and/or remove the heat energy from the support section,
wherein, when a substrate is supported by the support section, it is thermally coupled to the support section such that, when the conditioning system supplies heat energy to or removes heat energy from the support section, energy in turn transfers from the support section to the substrate or to the support section from the substrate, respectively,
wherein the conditioning system has a first portion thereof in a first region of the substrate that is adjacent the edge of the substrate and is on opposite sides of the center of the substrate and a second portion thereof in a second region of the substrate,
wherein (i) the first portion is structurally different than the second portion such that, for a common heat transfer energy input to the first and second portions, the heat transfer to or from the substrate per unit area of the substrate as a result of the operation of the conditioning system is greater in the first region for a given heat load and/or temperature change than it is in the second region for the given heat load and/or temperature change, or (ii) the control system is further programmed to control the conditioning system such that the heat transfer to or from the substrate per unit area of the substrate as a result of the operation of the conditioning system is greater in the first region for a given heat load and/or temperature change than it is in the second region for the given heat load and/or temperature change, or (iii) both (i) and (ii), and
wherein the control system is configured to control the conditioning system to provide the heat transfer to or from the substrate per unit area of the substrate that is greater in the first region than it is in the second region at least during a radiation beam exposure process applied to the substrate.

* * * * *